United States Patent [19]

Kaufmann et al.

[11] 4,258,364
[45] Mar. 24, 1981

[54] DISPLAY DEVICE HAVING ADJOINING DISPLAY ELEMENTS, AND A METHOD OF PRODUCING THE DISPLAY DEVICE

[75] Inventors: Meinolph Kaufmann, Fislisbach; Allan R. Kmetz, Nussbaumen, both of Switzerland

[73] Assignee: BBC Brown Boveri & Company Limited, Baden, Switzerland

[21] Appl. No.: 862,541

[22] Filed: Dec. 20, 1977

[30] Foreign Application Priority Data

Dec. 24, 1976 [CH] Switzerland .................. 16302/76

[51] Int. Cl.³ .................................................. G06F 3/14
[52] U.S. Cl. ............................... 340/765; 340/754; 340/805; 340/784
[58] Field of Search ............ 340/166 EL, 324 M, 336, 340/754, 784, 765, 805, 756; 350/333, 332, 331, 355, 356, 346

[56] References Cited

U.S. PATENT DOCUMENTS

| | | | |
|---|---|---|---|
| 3,976,362 | 8/1976 | Kawakami et al. | 340/324 M X |
| 3,995,942 | 12/1976 | Kawakami et al. | 340/336 X |
| 4,050,064 | 9/1977 | Hashimoto et al. | 340/336 X |
| 4,062,626 | 12/1977 | Kawakami et al. | 340/324 M X |
| 4,109,241 | 8/1978 | Shanks | 340/784 |
| 4,116,543 | 9/1978 | Stein | 340/784 |
| 4,117,472 | 9/1978 | Freer et al. | 340/324 M |
| 4,119,367 | 10/1978 | Raynes et al. | 340/784 |

FOREIGN PATENT DOCUMENTS 2408062  8/1975  Fed. Rep. of Germany .

OTHER PUBLICATIONS

Tobias, Martin, *International Handbook of Liquid Crystal Displays, 1975-1976*, London: 1975, 1976, pp. 85-94.
Freer, "Current Liquid Crystal Display Technology", *Microelectronics and Reliability*.

*Primary Examiner*—Marshall M. Curtis
*Attorney, Agent, or Firm*—Oblon, Fisher, Spivak, McClelland & Maier

[57] ABSTRACT

A display device including a plurality of adjoining display elements which comprise front and rear electrodes. The display elements are disposed geometrically in at least one row and are electrically grouped together to form at least one matrix. The display device further includes a drive circuit which drives the display elements in such a manner that along each row there is at most one transition from a first optical condition to a second optical condition different from the first.

3 Claims, 16 Drawing Figures

DISPLAY DEVICE HAVING ADJOINING DISPLAY ELEMENTS, AND A METHOD OF PRODUCING THE DISPLAY DEVICE

BACKGROUND OF THE INVENTION

1. Field of the Invention

This invention relates to a display device having adjoining display elements and more particularly, to a liquid crystal display suitable for use in instrument panels.

2. Description of the Prior Art

Display elements disposed geometrically in at least one row are excellently suited for displaying analogue information, such as speed, temperature, or pressure. A known example of this kind is the mercury thermometer. In this case the length of the column of mercury is proportional to the measured variable temperature.

Electronic display devices of this kind can be produced by linear arrangement, or for example in the case of the representation of time also by circular arrangement, of individual electro-optical display elements. If a display device of this kind is to have sufficiently great resolving power, a large number of individual elements is required. If each of these individual elements is individually driven, a large number of electronic drive stages and connecting lines is required, which usually is prohibitively costly.

For this reason display devices have been developed which have display elements grouped together in matrix fashion and also with multiplex driving—see German Offenlegungsschrift No. 2,408,062.

In liquid crystal displays having no optical storage the maximum achievable contrast is limited by the transient response of the individual display elements. With multiplex drive and with a 50% pulse duty factor, display elements whose switch times are sufficiently short give a mean contrast which corresponds to half the peak contrast. Nematic liquid crystal displays, whose optical drive state follows the effective value of the drive voltage, have a very limited mean contrast which corresponds to that of static driving of the display elements at about 2.2 times the effective value of the threshold voltage.

SUMMARY OF THE INVENTION

Accordingly, one object of this invention is to provide a novel display device which is more versatile in use than the known display devices.

Another object of this invention is to provide a novel display device which has high contrast, even with a large number of display elements.

These and other objects of the present invention are achieved by a novel display device wherein the various selected and non-selected electrode elements are driven by drive signals of differing multiples of the threshold voltage $u_o$ of the display elements, each drive signal exhibiting identical waveform shapes. A drive signal with an amplitude of $2u_o$ is applied to the common electrode B of the partly selected group of display elements, which electrode consequently belongs both to non-selected and to selected display elements. To the individual electrodes of the non-selected display elements of this group, drive signals with an amplitude of $+u_o$ are applied; while to the individual electrodes of the selected display elements of this group, drive signals with an amplitude of $-u_o$ are applied. A zero potential is applied to the common electrodes of each group of completely non-selected display elements. To the common electrode of each group of completely selected display elements is applied a drive signal which has an amplitude such that the display elements are driven at least with the same intensity as the selected display elements of the partly selected group.

A preferred process for producing a display device having a glass-sealed liquid crystal cell is characterized in that in a first stage of the process a glass frit web is applied to the inner side of a cell plate, while on the conductor paths disposed on the edge there are alternately applied, staggered from one conductor path to the adjoining conductor path, cylindrical impressions which are produced by screen printing and which after registration of the cell plates during assembly alternately connect oppositely situated conductor paths of one cell plate to conductor paths of the other cell plate. At least the impressions consists of a mixture of glass frit and metal particles, the metal particles being added in a weight proportion of from 1 to 50 °/oo of the entire mixture. In another stage of the process the cell is glass-sealed at a temperature of more than 400° C. and for a period of time of more than 5 minutes.

BRIEF DESCRIPTION OF THE DRAWINGS

A more complete appreciation of the invention and many of the attendant advantages thereof will be readily obtained as the same becomes better understood from the following detailed description when considered in connection with the accompanying drawings, wherein:

FIG. 7b is a view of the front cell plate corresponding to FIG. 7a;

FIG. 7c is a view of the screen printing master for contacting the front cell plate shown in FIG. 7a;

DETAILED DESCRIPTION OF THE PREFERRED EMBODIMENTS

Figure 1:
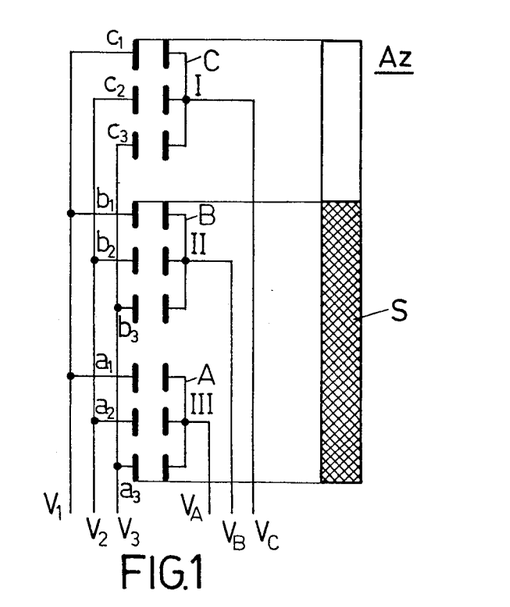
FIG. 1 is a diagrammatical representation of a bar display with electrodes grouped together in matrix form.

Referring now to the drawings, wherein like reference numerals designate identical or corresponding parts throughout the several views, and more particularly to FIG. 1 thereof, there is seen a display device having electrodes $a_1$ to $c_3$, which are arranged in electrode groups I-III. Oppositely situated pairs of electrodes form a respective display element together with an interposed activatable substance.

These display elements are electrically grouped together to form a 2×3 matrix. Individual electrodes $c_1$, $b_1$, $a_1$ and $c_2$, $b_2$, $a_2$ and $c_3$, $b_3$, $a_3$, which are of the same rank, are connected together by means of connecting lines. The common electrodes A to C which lie opposite the individual electrodes are likewise each provided with a connecting line.

An assumed drive condition is displayed in the display window Az; the activated column S here represents a measured analog variable.

Figure 2:
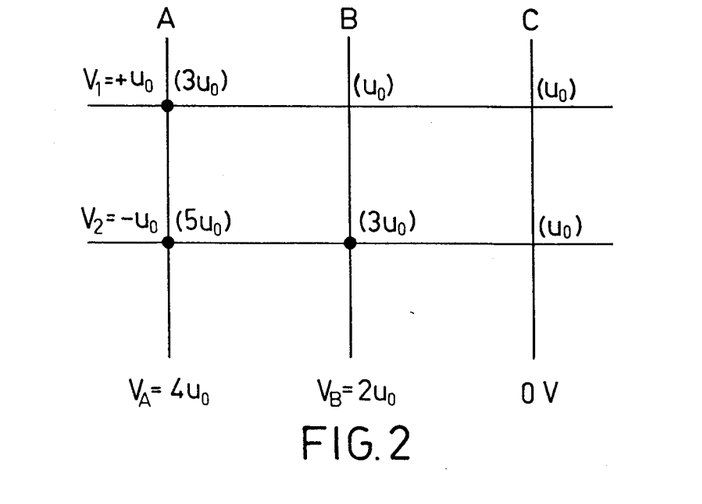
FIG. 2 is a representation of the matrix of the display shown in FIG. 1, with the drive condition symbolized by dots.

FIG. 2, which represents the matrix, shows symbolically in the form of dots the drive condition displayed in the display window Az. Here the common electrodes A, B, C represent the columns, and the individual electrodes grouped together and of the same rank represent the rows.

In order to achieve the drive condition symbolized, a drive signal $V_1$ with an amplitude of $+u_0$ lies on the first row, while on the other row there is a drive signal $V_2$ with an amplitude of $-u_0$ volt. At the common electrode C of group I composed completely of non-selected display elements a zero potential 0V exists. At the common electrode B of group II which is partly composed of selected display elements, this group containing both non-selected and selected display elements, there is a drive signal $V_B$ with an amplitude of $2u_0$ volt. A drive signal $V_A$ with an amplitude of $4u_0$ volt is applied to the common electrode A of group III composed completely of selected display elements. (In the present example each type of row and column is shown only once.)

From the differential voltage existing at the coincidence points of the matrix, the drive condition of the elements can be determined in a simple manner. It is here found that with a matrix driven in accordance with this diagram, as a minimum the triple value of $u_0$ exists at the selected display elements. In FIG. 2 the respective differential voltages are indicated in brackets.

The present drive diagram is independent of the voltage form selected, for example rectangular, sinusoidal, etc., and the individual drive signals differ only in respect of amplitude. The application of this basic principle is not restricted to a specific type of display, the prerequisite for its applicability simply being that $u_0$ volts should at least approximately correspond to the threshold voltage of the display elements.

If the display elements have a symmetrical display characteristic in relation to the polarity of the voltage applied, or if it is similar to a diode characteristic, that is to say if the display element does not react to negative voltages, all the non-selected display elements are in the optically unactivated state as long as $u_0$ is selected so that this voltage is lower than or equal to the threshold voltage of the display elements.

If the amplitude of the drive voltage is selected to be equal to the threshold voltage, this drive diagram results in a 36% improvement of the display in comparison with multiplex drive.

In dependence on the characteristic of the display element, satisfactory operation is also possible with drive signals which amount to more than the threshold voltage or a multiple of the threshold voltage.

From FIG. 2 it can also be seen that the group of completely selected display elements is activated with different intensities. The difference between activation with $3u_0$ and activation with $5u_0$ can scarcely if at all be detected if the display elements are in the saturation range of their characteristic with activation above $3u_0$.

Among numerous display elements which can be selectively operated in accordance with this operation diagram, liquid crystal displays are particularly suitable because of their special threshold voltage and saturation characteristic.

For example, in liquid crystal displays which use the cholesteric phase change effect, complete saturation occurs in the induced homeotropic phase so no difference is perceptible between operation with $3u_0$ and $5u_0$, whereas the focal conic phase is likewise uniform because all display elements are operated with $u_0$.

By way of comparison, twisted nematic liquid crystal cells have a sharply defined threshold value and saturate with increasingly high voltages. Optical differences can be detected with twisted nematic liquid crystal cells in the range between $3u_0$ and $5u_0$. This, however, is not a source of error, but a tolerable "beauty defect", which for normal viewing, that is to say viewing perpendicular to the surface of the cell, is scarcely detectable but becomes more apparent when viewed from an angle. The same conditions also apply to displays working on the principle of dynamic scattering (DSM).

In contrast thereto the present drive diagram is less suitable for liquid crystal cells which utilize the tunable birefringence effect, since its saturation takes place relatively slowly in dependence on the voltage applied.

By means of a modified drive signal applied to the common electrode A of the completely selected electrode group the drive principle of the invention can also be applied to display elements having these or similar characteristics.

In general, nematic liquid crystals respond to the effective value of the voltage applied to the electrodes. If column drive signals are applied with a waveform which is of such a nature that across the display element there is obtained a potential difference with an effective value which is independent of the sign of the drive signal on the row of the matrix, a constant optical effect will accordingly also be obtained. This can for example be achieved by applying to the column of the matrix a drive signal which has the same waveform as the drive signal applied to the rows of this matrix but has a phase displacement of 90° in relation thereto. The same effect can be achieved if the two drive signals are in a whole number frequency ratio different from one.

In the following example of embodiment shown in FIG. 3 the above described principle is applied. The amplitude of the control signal applied to the columns is adjusted so that the root-mean-square voltage $3u_0$ exists at all selected display elements. All the drive signals V here have a rectangular waveform. The amplitude of the drive signals $V_1$, $V_2$ applied to the rows of the matrix equals $u_0$, these signals being in phase opposition to one another. On the column corresponding to the common electrode of the group of completely selected display elements, there exists a bipolar drive signal $V_A$ with an amplitude of $2 \times \sqrt{2} u_0$. The phase of this signal is displaced 90° in relation to the drive signals on the lines $V_1$, $V_2$. On another column, corresponding to the group of partly selected display elements, there is another bipolar drive signal $V_B$ with an amplitude of $2u_0$, this signal having the same frequency and being in phase opposition to the drive signal $V_2$ applied to the second line of the matrix. On the columns corresponding to the non-selected display elements, the drive signal $V_C$ with zero potential is applied.

Because potential differences of $3u_0$ exist on the electrodes of the activated display elements, this drive principle is excellently suited for operating twisted nematic and also DSM liquid crystal displays with matrix type drive.

Liquid crystal displays which utilize the tunable birefringence effect can be operated therewith in the range of the threshold voltage, which results in a uniform, accurately defined interference color. Otherwise it is possible to operate between two interference colors by appropriately increasing the drive signals V, that is to say by means of this drive principle it is possible to display modulated colored information.

Further details for the construction of such colored displays are known from "Nonemissive Electrooptic Displays" AR. Kmetz and FR. von Willisen, Plenum New York 1976, pages 49 to 59.

In addition, the invention is also suitable for display devices consisting of a plurality of individual displays, such as for example a plurality of juxtaposed bar displays or concentrically disposed annular displays, which serve to display a measured variable in comparison with a reference value, or which serve for the simultaneous display of different measured variables after the style of a histogram.

Figure 4:
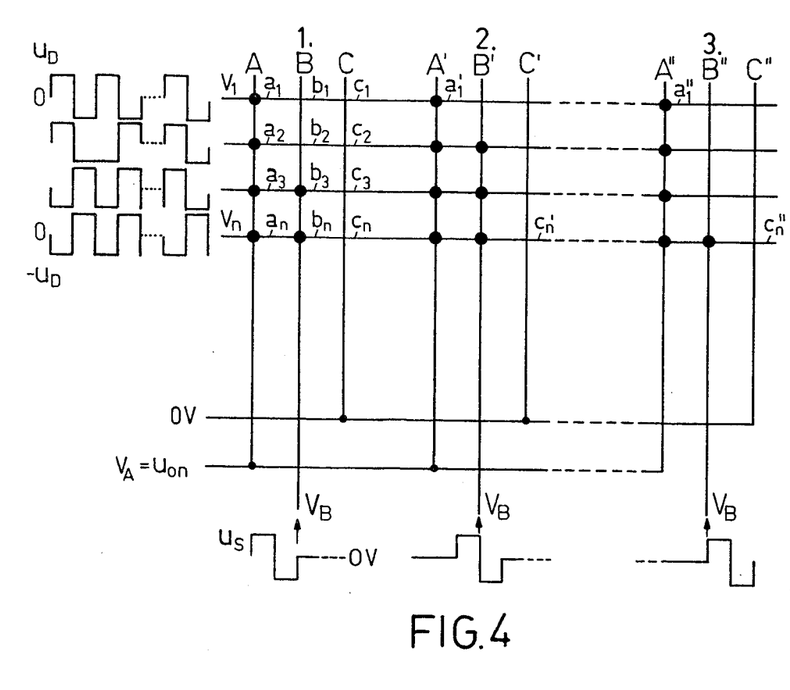
FIG. 4 is an illustration of the principle of a display device which consists of a number of display elements disposed geometrically in rows and grouped together electrically to form matrices.

In FIG. 4 this is explained with the aid of an example of embodiment. The individual displays are here designated 1., 2., 3.

The individual electrodes of the display elements are in the form of rows of a combined matrix, the elements of equal rank being connected together. In contrast thereto the common electrodes of the groups are taken out of the matrix individually as columns. The selection of the display elements of the single group of partly selected display elements of each individual display 1., 2., 3. at any particular moment is effected using a time multiplex process and sequentially applying a bipolar drive signal $V_B$ to the corresponding columns of the matrix, this drive signal $V_B$ having an amplitude of $u_s$ and being synchronous to the drive signals $V_1 \ldots V_n$ applied to the lines.

If the display device consists of M individual displays, the multiplex pulse duty factor is 1/M, the number of individual display elements per display not being taken into account.

This drive scheme differs from conventional multiplex drive methods in that only the group of partly selected display elements of each display is driven sequentially. The groups of completely driven and completely non-driven drive elements are in this arrangement statically addressed, as can be seen from FIG. 4.

By way of comparison the multiplex pulse duty factor with conventional multiplex drive amounts to $\leq 1/(M+1)$, which is considerably poorer, particularly if the number of individual display rows is small.

Drive signals $V_1$-$V_n$, which are bipolar square-wave voltages with an amplitude of $u_D$, are applied to the rows. The other drive signals have amplitudes of 0V for $V_C$ (groups of non-selected drive elements) and $U_{on} = 2u_s = 4u_D$ for $V_A$ (ups of completely selected display elements).

With the phase change effect the drive signal V applied to the rows in a given partly selected group produces a peak voltage of $3u_D$ on the selected display elements, which corresponds to operation in the nematic phase; the non-selected display elements of the same group remain in the focal conic phase as long as $u_D \leq$ the threshold voltage. Outside the strobe period of the given column of the matrix, the drive signals V tend to retain in their previously written states. This drive amplitude acts as a bias voltage below the threshold value of the display elements. Groups of completely non-driven display elements or selected display elements are still addressed statically.

The drive principle explained above can also be applied to display devices consisting of a plurality of twisted nematic display elements arranged in rows. For this purpose it must simply be taken into account that the nematic liquid crystal layer responds to the root-mean-square voltage value of the drive signals.

When $M \leq 4$, $u_s = 2u_D$ and $u_D \leq$ threshold voltage, the root-mean-square voltage at the electrodes of the selected display elements in a group of partly selected display elements amounts to $U_{rms} = \sqrt{(8/M) + 1} \cdot u_D$.

When $M > 4$, $u_s = \sqrt{M} u_D$ and $u_D = \sqrt{M}/2 (\sqrt{M} - 1)$ times the threshold voltage, the root-means-square voltage applied to the selected display elements in a partly selected group, $u_{rms}$ amounts to $\sqrt{(M+1)/(\sqrt{M}-1)}$ times the threshold voltage.

If the voltage at a selected display element of the group of completely selected display elements is never less than $u_{rms}$ even in the worst case, it will be necessary that $u_{on} \geq u_{rms} + u_D$.

It may be observed in this connection that the same voltage level, taken from a common power supply can be used for the amplitude $u_{on}$ and for the amplitude $u_s$ as long as $M > 7$.

As already described above, a bar display having a twisted nematic liquid crystal layer or a liquid crystal layer which utilizes the tunable birefringence effect or the DSM effect, for example, can be operated by modification of the drive signal at the display elements of the groups of completely selected display elements. For this purpose use is made once again either of a phase displacement by 90° of the corresponding drive signals V or of different frequencies having a whole number multiple frequency ratio differing from 1.

In this case a drive signal V should be applied to the group of completely selected display elements with such an amplitude $u_{on}$ that $u_{on} = \sqrt{u_{rms}^2 - u_D^2}$, thus giving uniform activation of all selected display elements.

This modified drive principle permits the use of a lower drive amplitude $u_{on}$.

A display device consisting of two bar displays, M=2, also has the advantage that a single power supply is sufficient to drive the columns, since $u_{on}=u_s=2u_D$.

Figure 3:
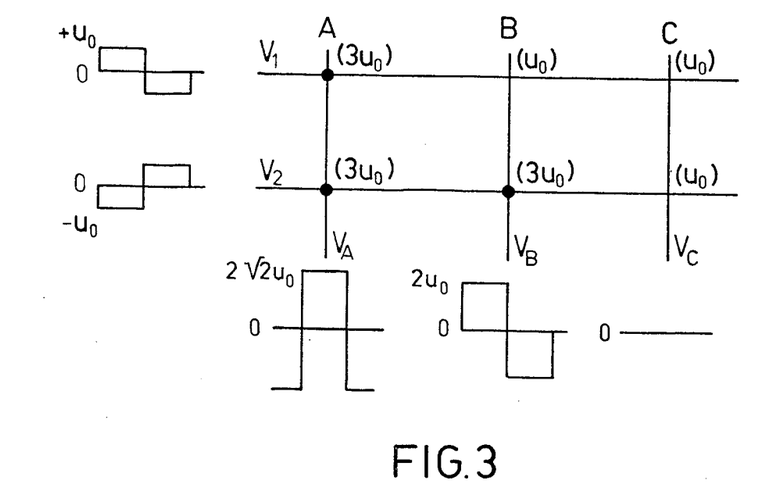
FIG. 3 is a representation of another matrix with the drive modified in relation to FIG. 2.

For the production of display devices which have a multiplicity of electrode elements and accordingly require a large number of connecting wires, a simplification can be achieved by guiding the lines on both sides of the bar-shaped rows (see FIG. 3). The density of contact points per cell plate can thus be reduced by 50% in comparison with wiring disposed on only one side of the bars.

Figure 5:
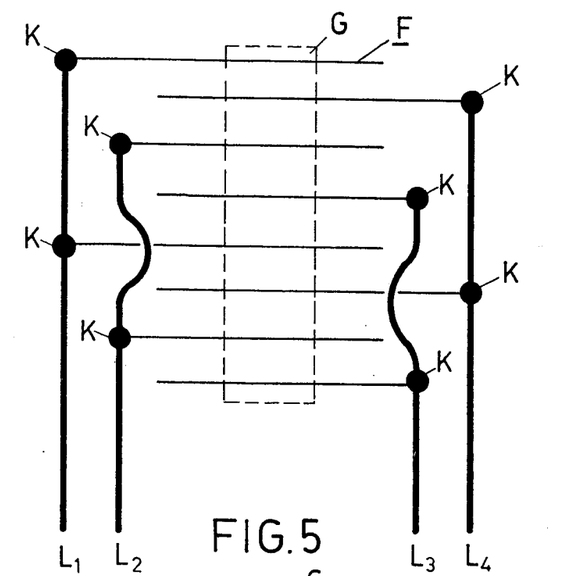
FIG. 5 is an illustration of the principle of a preferred solution for the electrical contacting of the display elements of a bar display.

The danger of short-circuits is also reduced thereby, and this danger can be further reduced by means of an arched curvature of the wires, as shown in FIG. 5.

In FIG. 5 the diagrammatically represented back electrode is designated R, while the group electrode is designated G. On the rear cell plate are provided the conductor paths $L_1$-$L_4$, on which there are applied by the screen printing process imprints K which make contact with the front electrodes F alternately from the left-hand and right-hand sides of the bar.

Figure 6:
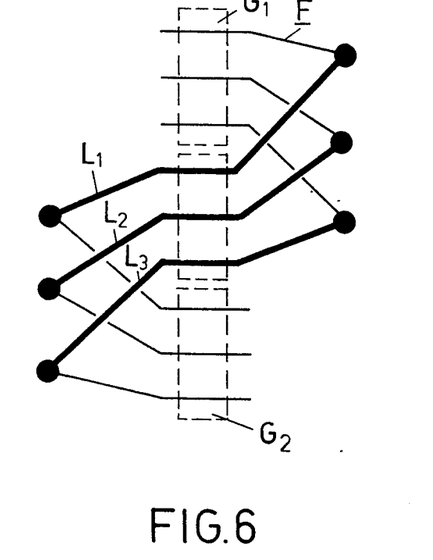
FIG. 6 is an illustration of the principle of the contacting of a multiplicity of display elements, the lines being guided alternately over two planes.

FIG. 6 shows diagrammatically another principle for the contacting of a multiplicity of display elements, wherein the individual and common electrodes of each group are situated alternately on the front and rear cell plates. Through this connection scheme, display elements or electrodes can be continuously contacted in a separate space without the sequence of the individual fed display elements having to be changed, such as is necessary for example with wires guided in serpentine fashion in one plane.

Accordingly the principle of arrangement of the wires shown in FIGS. 5 and 6 does not require additional electronic decoding stages.

Figure 7A:
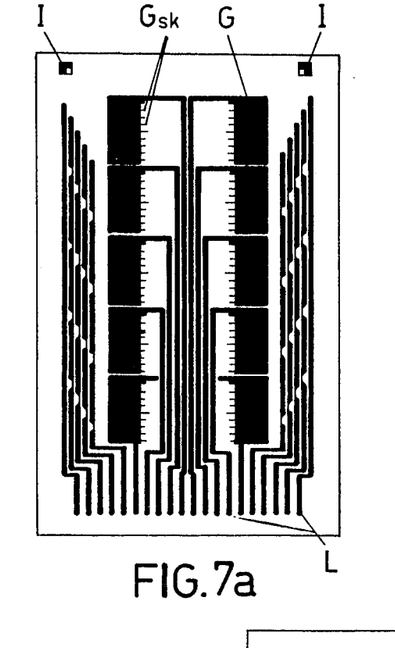
FIG. 7a is a view of a rear cell plate of a display with scales which can be read without parallax on the group electrodes.
Figure 7B:
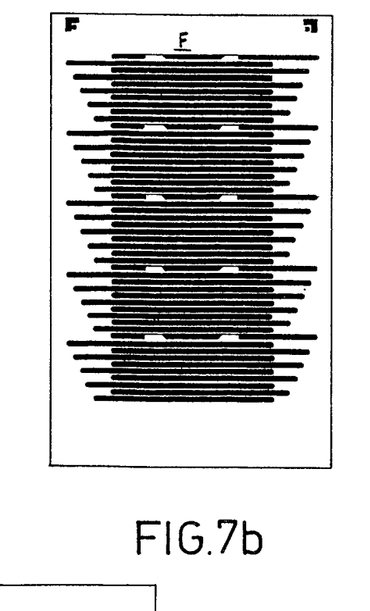
Figure 7C:
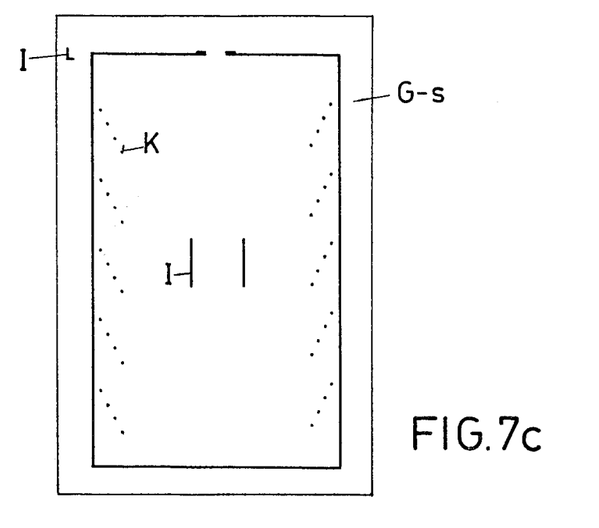

In FIGS. 7a–7c the construction or production of a bar display having a scale divided into 100 individual steps is shown. This relates to a liquid crystal display device having a twisted nematic liquid crystal layer. It is noteworthy that, as shown in FIG. 7a, the group electrodes G, i.e. the columns of the matrix, are provided with scale graduations $G_{SK}$. This provides the particular advantage that simplified production is possible, while the scale values can be subsequently printed on the front cell plate without particular accuracy being required. The measurement displayed can be read absolutely without parallax. The operation of positioning the cell plates before glass sealing is thus possible in the simplest accurate manner.

For certain applications the combination of a bar display with numerical displays is advantageous.

Figure 8A:
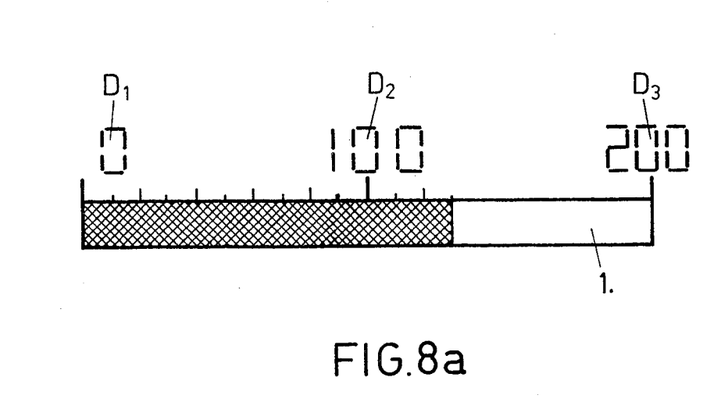
FIG. 8a is a view of the use of a display device according to the invention in conjunction with digital displays for displaying speed in vehicles.
Figure 8B:
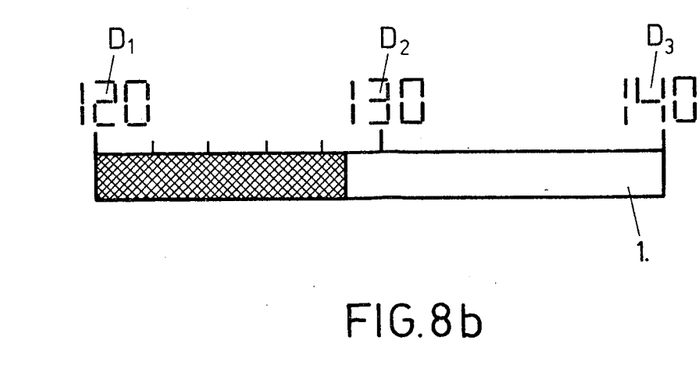
FIG. 8b is a view of the display device of FIG. 8a in an expanded scale mode with zero suppression for the reading of speed with fine resolution.

FIGS. 8a and 8b show a speed display for a vehicle. The arrangement shown in FIG. 8a provides an overview of vehicle speed with low resolution, as would for example be useful when accelerating to highway speed. For maintaining a chosen cruising speed, operation could be switched to that shown in FIG. 8b. The electrically alterable digital displays show that the bargraph now depicts a portion of the speed range on an expanded scale with suppressed zero. The effective resolution of the bargraph is thereby increased substantially.

For the matrix drive for a bar display according to the invention, each column (i.e. common electrode of a group) must be connected to one of three different drive signals while in addition each row (i.e., the individual electrodes) must be connected to one of two other drive signals.

Figure 9:
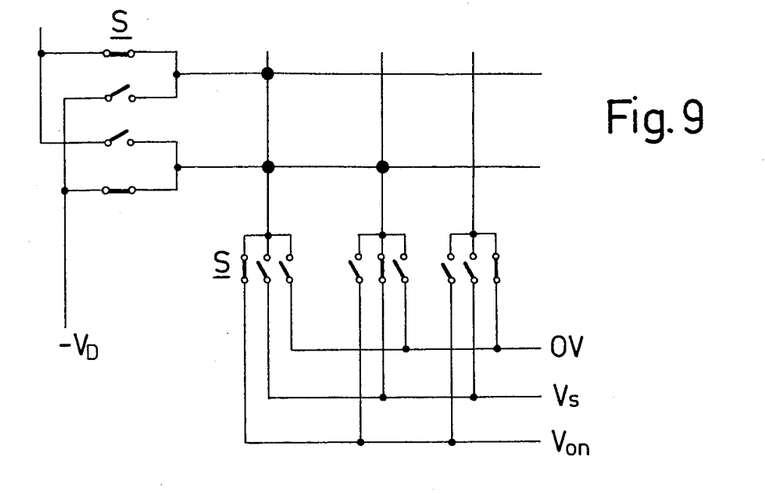
FIG. 9 is a circuit representation of the drive principle for selection in a display device according to the invention.

This is shown in simplified form in FIG. 9 by means of mechanical switches S. In practice the switches S are replaced by electronic switches, for example CMOS analog gates.

Since at the present time only single-pole electronic switches S are available on the market (SPST), the circuit arrangement shown in FIG. 9 is not produced with the aid of more complicated switches (for example SPDT and SP3T switches).

Figure 10:
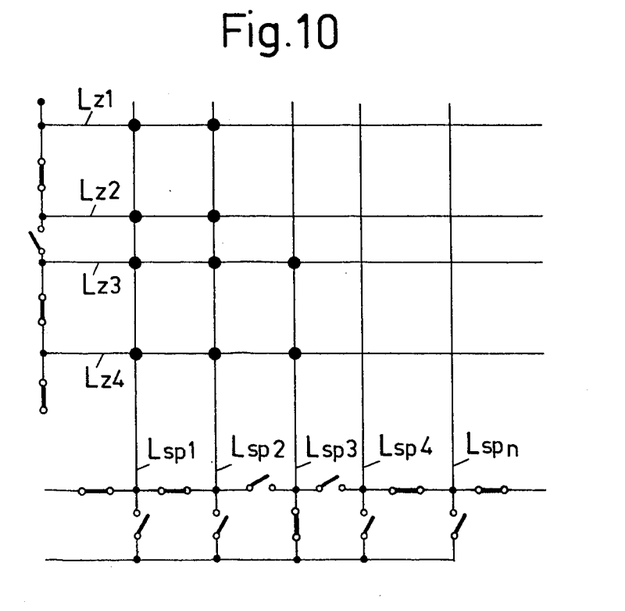
FIG. 10 is a circuit representation of a drive principle, which is improved in relation to FIG. 9, with the example of a four-line matrix.

From FIG. 9 it can be seen that for a bar display which consists of N display elements and is connected as a square matrix, the total number of all the switches needed for selection amounts to $5\times\sqrt{N}$. Because of the special selection conditions existing in a bar display or with other display elements arranged geometrically in rows, this switching principle can be simplified as shown in FIG. 10. In this embodiment each row is connected to its two neighboring rows instead of to two connecting buses.

At any given time only one switch is open which separates the rows which are connected to the drive signals V with an amplitude of $+u_D$, and $-u_D$. The columns of the selected groups are likewise connected together as a chain and the columns of the non-selected groups are connected together as another chain by switches.

Two of the switches are always in the open state, so that the two chains are separated and the group of partly selected display elements can individually receive the drive signal $V_s$.

By this means the number of switches required for selection can be reduced from $5\times\sqrt{N}$ to about $3\times\sqrt{N}$.

Figure 11:
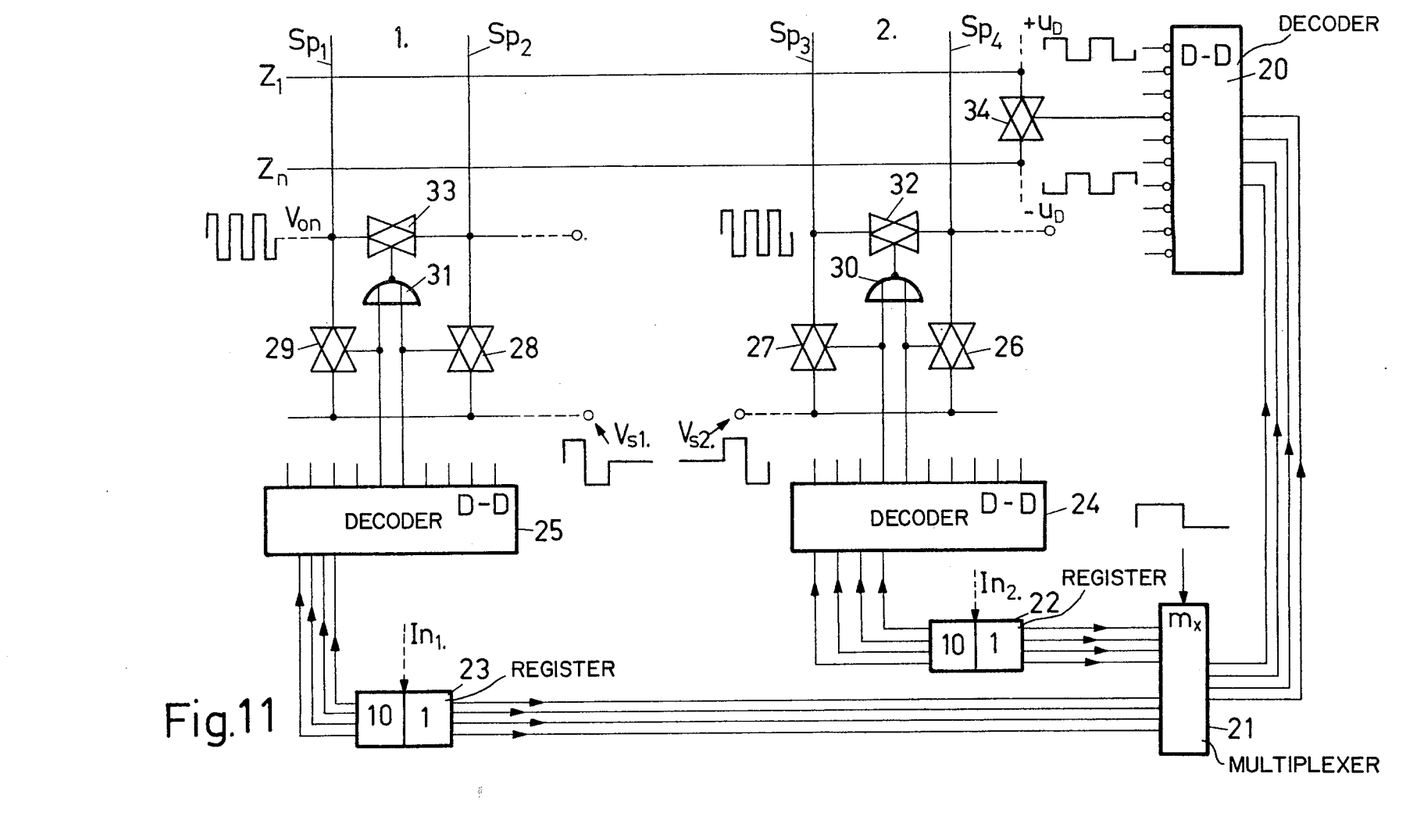
FIG. 11 is a circuit representation, in simplified form, of a drive circuit for a display device consisting of two rows each of 100 display elements.

In FIG. 11 is shown diagrammatically a practical example of embodiment of a drive principle according to FIG. 10, which example has been found successful for driving bar displays in particular.

The driven bar display with a twisted nematic liquid crystal layer has $2\times 50$ display elements and is constructed in the manner illustrated in FIGS. 7a to 7c. Ten common electrodes, that is to say columns, can be seen in FIG. 7a, while 10 individual electrodes lines are provided for each group. This configuration requires a total of 20 drive wires.

The information to be displayed in bar 1 is fed as input signal $In_1$ to a BCD register 23, and the information to be displayed in bar 2 is fed as input signal $In_2$ to another BCD register 22. From these BCD registers 22, 23 the less significant digits are fed to a multiplex stage 21 and then to an inverting decade decoder 20. The outputs of this inverting decade decoder 20 are passed to CMOS analogue switches 34 which are disposed between the respective adjacent rows $Z_1$-$Z_n$ of the matrix consisting of the display elements of bars 1,2. Rectangular signals with an amplitude of $+u_D$ accordingly lie on these lines $Z_1\ldots Z_n$.

The more significant digits in the BCD registers 22 and 23 are decoded in decade decoders 24 and 25, applying through CMOS analogue switches 26–29 the drive signals $V_{S1}$, $V_{S2}$ to the corresponding partly selected columns $Sp_1$-$Sp_4$. These drive signals $V_{S1}$, $V_{S2}$ act as scanning signals on the matrix and correspond in respect of time with the respective signals applied to the rows $Z_1$-$Z_n$. The drive signals $u_{on}$ and 0 are correctly fed to all other columns because the CMOS analogue switch 33 or 32 connected to the respective neighboring columns is in the closed state until a drive signal appears on the neighboring columns. The CMOS analogue switch is operated in this way by means of the NOR gates 30 and 31.

Figure 12:
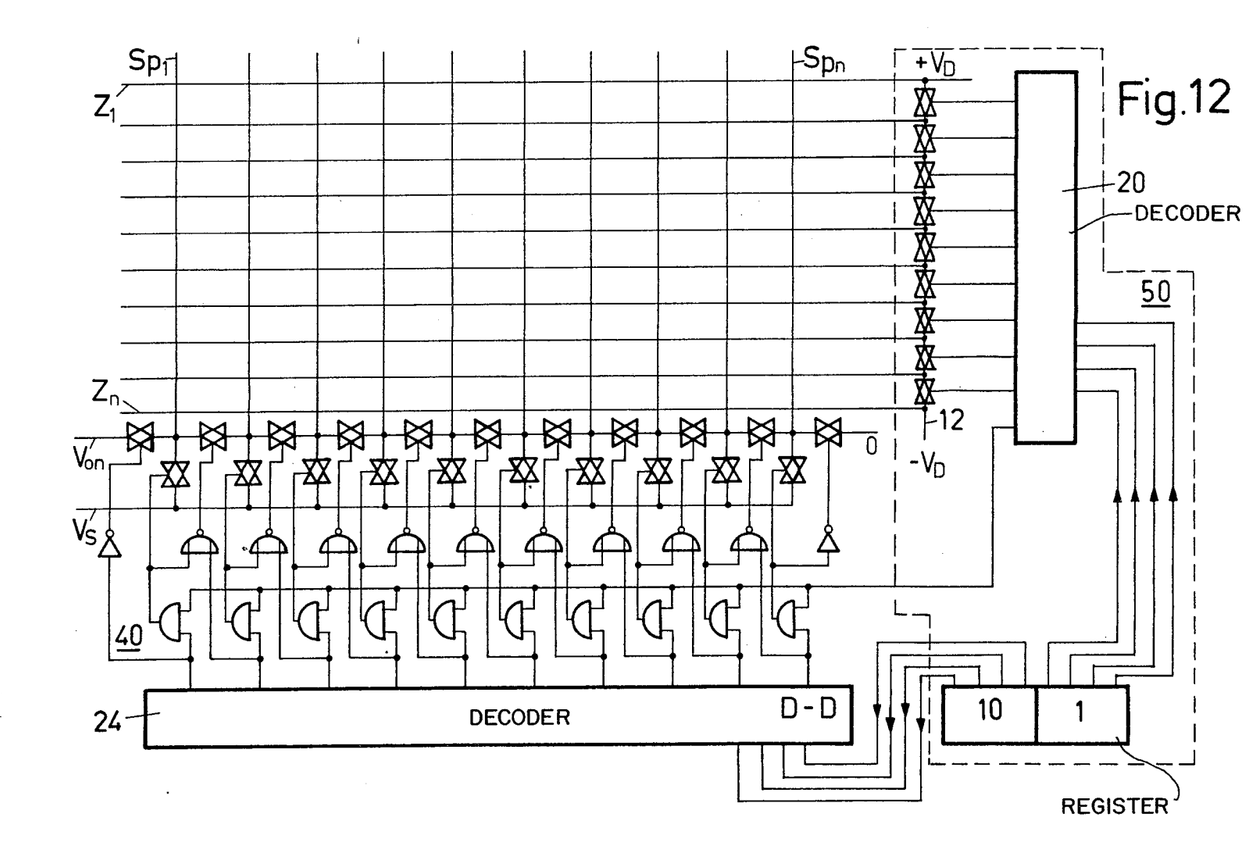
FIG. 12 is a circuit representation of a drive circuit for a display device comprising 100 display elements.

FIG. 12 shows an alternative drive circuit arrangement, which is slightly modified in relation to FIG. 11, taking as example a display device consisting of a bar of 100 display elements. Here the redundant coding (shown in FIG. 11 and effected through a total of 10 CMOS analogue switches) of the first non-selected column as an empty partially selected column is eliminated, this being made possible by a drive logic circuit 40.

Figure 13:
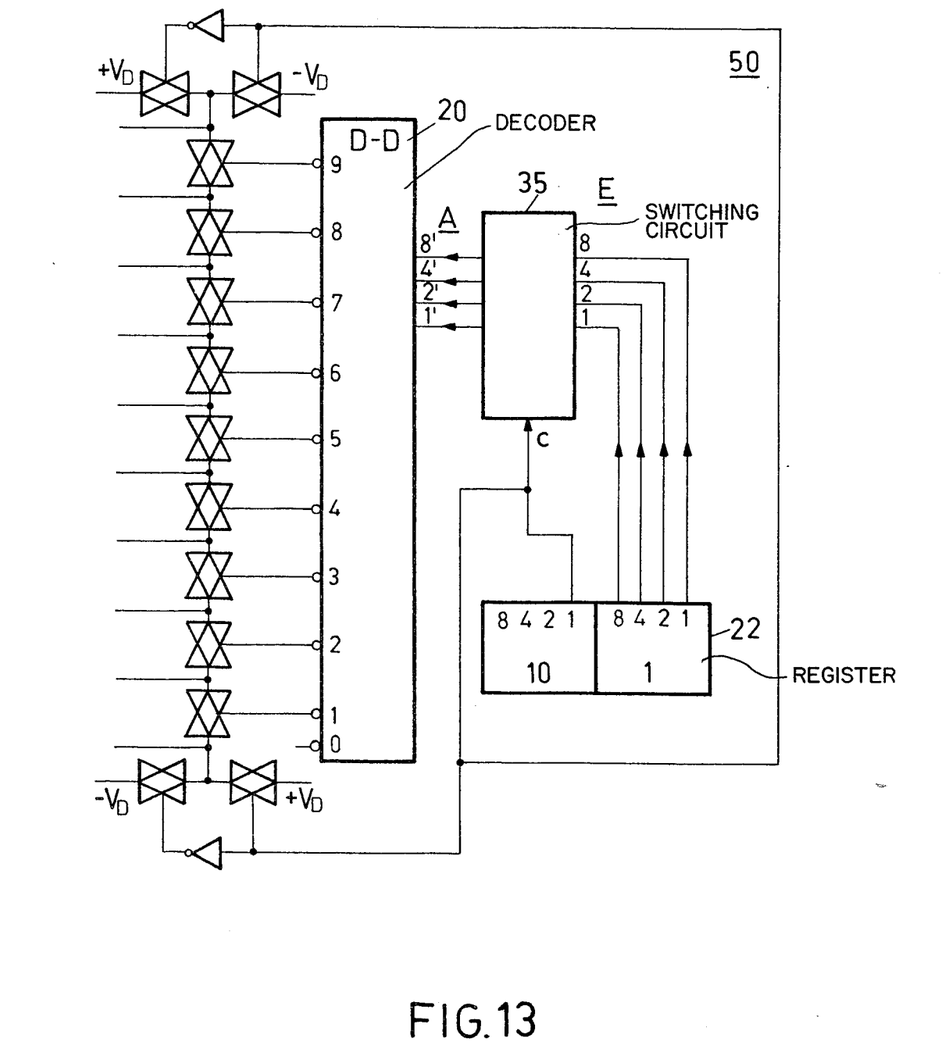
FIG. 13 is a circuit representation of a modified drive circuit according to FIG. 12, serving to reduce through-contacting between the cell plates.

In the case of conductor paths disposed in meander form on a single cell plate for the feeding of individual electrodes, without or with only a few imprints K for mutual contacting, it is advantageous for the row drive circuit 50 shown in FIG. 12 to be modified in accordance with FIG. 13.

According to FIG. 13, when the more significant digit present in the BCD register 22 is even, the control signal C shows a logical "0", so that the less significant digit which is present in the BCD register 22 can pass unchanged through the radix complement switching circuit 35.

If however the more significant digit present in the BCD register 22 is odd, there will be a control signal C of logical "1", which controls the radix complement switching circuit 35 in such a manner that there is formed at its output A a BCD number the sum of which with the BCD number of the input E makes ten. In general, the radix is chosen equal to the number of rows in the matrix, i.e. the number of individual segments in each group.

Base number complement switching circuits of this kind, having an input/-output function summarized in the accompanying values table, are known from Analog and Digital Computer Technology, N. R. Scott, McGraw-Hill, New York, 1960.

| Values Table of the Base Number Complement Circuit (35) | | | | |
|---|---|---|---|---|
| Control signal C | Input | | Output | |
| | Decimal | 8 4 2 1 | Decimal | 8' 4' 2' 1' |
| 0 | 0 | 0 0 0 0 | 0 | 0 0 0 0 |
| 0 | 1 | 0 0 0 1 | 1 | 0 0 0 1 |
| 0 | 2 | 0 0 1 0 | 2 | 0 0 1 0 |
| 0 | 3 | 0 0 1 1 | 3 | 0 0 1 1 |
| 0 | 4 | 0 1 0 0 | 4 | 0 1 0 0 |
| 0 | 5 | 0 1 0 1 | 5 | 0 1 0 1 |
| 0 | 6 | 0 1 1 0 | 6 | 0 1 1 0 |
| 0 | 7 | 0 1 1 1 | 7 | 0 1 1 1 |
| 0 | 8 | 1 0 0 0 | 8 | 1 0 0 0 |
| 0 | 9 | 1 0 0 1 | 9 | 1 0 0 1 |
| 1 | 0 | 0 0 0 0 | 0 | 0 0 0 0 |
| 1 | 1 | 0 0 0 1 | 9 | 1 0 0 1 |
| 1 | 2 | 0 0 1 0 | 8 | 1 0 0 0 |
| 1 | 3 | 0 0 1 1 | 7 | 0 1 1 1 |
| 1 | 4 | 0 1 0 0 | 6 | 0 1 1 0 |
| 1 | 5 | 0 1 0 1 | 5 | 0 1 0 1 |
| 1 | 6 | 0 1 1 0 | 4 | 0 1 0 0 |
| 1 | 7 | 0 1 1 1 | 3 | 0 0 1 1 |
| 1 | 8 | 1 0 0 0 | 2 | 0 0 1 0 |
| 1 | 9 | 1 0 0 1 | 1 | 0 0 0 1 |

Display devices constructed in accordance with the concept of the invention can be produced rationally and economically. For this purpose, for example, a rear cell plate according to FIG. 7a is printed with the corresponding electrode and connecting line pattern in an electrically conductive substance by the screen printing process. Similarly, the inner side of a front cell plate, consisting for example of glass, is printed with the pattern consisting of individual electrodes, as shown in FIG. 7b. In a first stage of the process a glass solder web G—S and also imprints K are simultaneously applied, likewise by a screen printing process, to the conductive layers on that side of the front cell plate which is provided with electrodes (FIG. 7a). FIG. 7c shows the corresponding screen printing pattern, with I designating the elements serving for registration and corresponding to the cell plate registration elements I of FIG. 7a. The imprints K are cylindrical in shape and are situated at the intersection points of the conductor paths L and the electrode elements F of the other cell plate. After the rear cell plate (FIG. 7b) has then been connected and correctly positioned, in another stage of the process the cell is glass sealed at a temperature of 470° C. for a period of about 10 minutes.

Since the imprints K consist of a mixture of glass frit and metal particles, the metal particles added comprising a proportion by weight of from 1 to 50°/oo, during the glass soldering electrically conductive contact bridges are formed between the conductor paths 1 of the one cell plate and the electrode elements of the other cell plate. Gold and silver powder with a grain size of from 5 to 20μ has been found particularly suitable for use as metal particles.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. In a display device for displaying information in the form of a column by controlling a plurality of display elements forming the display device, said display elements adjoining one another and disposed geometrically in at least one row, each of said display elements having an electro-optical medium arranged between a front and a rear electrode and optically activated by a differential voltage applied to said electrodes and exceeding a threshold, selected front electrodes of said display elements being connected to form segment electrodes, selected rear electrodes being connected to form group electrodes, and the segment and group electrodes being controlled by electrical drive signals having a rectangular wave form, the improvement comprising:

means for applying two identical first drive signals having a phase shift of $\pi$ relative to one another and having an amplitude ($u_o$) corresponding at least to the threshold voltage of the electro-optical medium to two adjacent segment electrodes ($a_1$, $b_1$, $c_1$; $a_2$, $b_2$, $c_2$) adjoining each other in a row of display elements having a common group electrode, said first drive signals being bipolar square waves;

means for applying a second drive signal identical with one of said first drive signals, however, having a two-fold amplitude (2 $u_o$) to a group electrode (B) comprising activated ($b_3B$, $b_2B$) and non-activated ($b_1B$) display elements;

means for applying a third drive signal to a group electrode (A) comprising exclusively activated display elements ($a_1A$, $a_2A$, $a_3A$), said third drive signal having values of frequency, phase and amplitude such that the threshold voltage of the electro-optical medium is smaller than the differential voltage across said group electrode (A) comprising exclusively activated display elements ($a_1A$, $a_2A$, $a_3A$) and respective segment electrodes; and means for applying a zero drive signal to a group electrode (C) comprising exclusively non-activated display elements ($c_1C$, $c_2C$, $c_3C$).

2. A display device according to claim 1 in which said third drive signal comprises a signal otherwise identical to said second drive signal, however, having twice the amplitude ($4 u_o$) of said second drive signal.

3. A display device according to claim 1 in which said third drive signal comprises a signal otherwise identical with said second drive signal, however having a $\sqrt{2}$-fold amplitude ($2\sqrt{2} u_o$) and a phase shift of $\pi/2$ relative to said second drive signal.

* * * * *